(12) United States Patent
Smith

(10) Patent No.: US 7,948,162 B2
(45) Date of Patent: May 24, 2011

(54) LIGHT-EMISSIVE DISPLAY AND METHOD OF MANUFACTURING THE SAME

(75) Inventor: Euan C. Smith, Longstanton (GB)

(73) Assignee: Cambridge Display Technology Limited, Cambridgeshire (GB)

(*) Notice: Subject to any disclaimer, the term of this patent is extended or adjusted under 35 U.S.C. 154(b) by 602 days.

(21) Appl. No.: 11/734,248

(22) Filed: Apr. 11, 2007

(65) Prior Publication Data

US 2007/0241690 A1 Oct. 18, 2007

(30) Foreign Application Priority Data

Apr. 12, 2006 (GB) ................................ 0607370.4

(51) Int. Cl.
*H01J 1/63* (2006.01)
*H01J 63/04* (2006.01)

(52) U.S. Cl. ........ 313/503; 313/483; 313/504; 313/505; 313/506

(58) Field of Classification Search .................. None
See application file for complete search history.

(56) References Cited

U.S. PATENT DOCUMENTS

| | | | |
|---|---|---|---|
| 4,539,507 A | 9/1985 | VanSlyke et al. | |
| 6,020,869 A | 2/2000 | Sasaki et al. | |
| 6,878,312 B1 | 4/2005 | Kanbe et al. | |
| 7,508,126 B2 * | 3/2009 | Miyagawa | 313/504 |
| 7,663,299 B2 * | 2/2010 | Chao et al. | 313/500 |
| 2002/0047567 A1 * | 4/2002 | Fujita et al. | 315/169.3 |
| 2003/0160915 A1 * | 8/2003 | Liu | 349/106 |
| 2004/0178725 A1 * | 9/2004 | Karasawa et al. | 313/506 |
| 2009/0302331 A1 * | 12/2009 | Smith et al. | 257/88 |

FOREIGN PATENT DOCUMENTS

| | | |
|---|---|---|
| EP | 0 788 014 | 8/1997 |
| EP | 0 880 303 | 11/1998 |
| EP | 0 949 603 | 10/1999 |
| EP | 0 989 778 | 3/2000 |
| EP | 1 122 984 | 7/2000 |
| JP | 2004-227873 | 8/2004 |
| WO | WO-90/13148 A1 | 11/1990 |
| WO | WO-95/06400 | 3/1995 |

(Continued)

OTHER PUBLICATIONS

Baldo et al., "Very High-Efficiency Green Organic Light-Emitting Devices Based on Electrophosphorescence," *Appl. Phys. Lett.*, 75(1):4-6 (1999).

(Continued)

*Primary Examiner* — Nimeshkumar D. Patel
*Assistant Examiner* — Natalie K Walford
(74) *Attorney, Agent, or Firm* — Marshall, Gerstein & Borun LLP

(57) ABSTRACT

A light-emissive display comprising a substrate, a first electrode layer disposed over the substrate, a light-emissive layer disposed over the first electrode layer, and a second electrode layer disposed over the light-emissive layer, wherein the light-emissive layer is patterned to provide a plurality of discrete light-emissive regions, each discrete light-emissive region being a pixel, or a sub-pixel, of the light-emissive display, and wherein the first electrode layer and/or the second electrode layer comprises a plurality of electrodes, each electrode comprising at least two sub-electrodes associated with each discrete light-emissive region.

33 Claims, 7 Drawing Sheets

FOREIGN PATENT DOCUMENTS

| | | |
|---|---|---|
| WO | WO-99/21935 | 5/1999 |
| WO | WO-99/42983 | 8/1999 |
| WO | WO-99/48160 | 9/1999 |
| WO | WO-00/59267 | 10/2000 |
| WO | WO-01/16251 | 3/2001 |
| WO | WO-02/18513 | 3/2002 |
| WO | WO-02/067343 | 8/2002 |
| WO | WO-03/083960 | 10/2003 |
| WO | WO-2004/049466 | 6/2004 |

OTHER PUBLICATIONS

Deegan et al., "Capillary Flow as the Cause of Ring Stains from Dried Liquid Drops," *Nature,* 389:827 (1997).

Duineveld et al., "Ink-Jet Printing of Polymer Light-Emitting Devices," *Proceedings of SPIE,* 4464 (2002).

Fleuster et al., "Mass Manufacturing of Full Colour Passive Matrix and Active Matrix PLED Displays," *SID Proceedings,* 4.2 (2004).

Hebner et al., "Ink-Jet Printing of Doped Polymers for Organic Light Emitting Devices," *Appl. Phys. Lett.,* 72(5):519-521 (1998).

Inca Dainippon Screen Group, "Welcome" (2007) Retrieved from the Internet on Jul. 10, 2007: <URL: http://www.incadigital.com>.

Yang, "Review of Recent Progress on Polymer Electroluminescent Devices," *SPIE Photonics West: Optoelectronics '98,* Conf. 3279, San Jose (1998).

Combined Search and Examination Report for Application No. GB0607370.4, dated Aug. 1, 2006.

* cited by examiner

LIGHT-EMISSIVE DISPLAY AND METHOD OF MANUFACTURING THE SAME

FIELD OF INVENTION

This invention relates to a light-emissive display and a method of manufacturing the same.

BACKGROUND OF INVENTION

One class of light-emissive displays is that using an organic material for light emission. The basic structure of these devices is a light emissive organic layer, for instance a film of a poly(p-phenylenevinylene) ("PPV") or polyfluorene, sandwiched between a cathode for injecting negative charge carriers (electrons) and an anode for injecting positive charge carriers (holes) into the organic layer. The electrons and holes combine in the organic layer generating photons. In WO 90/13148 the organic light-emissive material is a polymer. In U.S. Pat. No. 4,539,507 the organic light-emissive material is of the class known as small molecule materials, such as (8-hydroxyquinoline) aluminum ("Alq3"). In a practical device one of the electrodes is transparent, to allow the photons to escape the device.

A typical organic light-emissive display is fabricated on a glass or plastic substrate coated with a transparent anode such as indium-tin-oxide ("ITO"). A layer of a thin film of at least one electroluminescent organic material covers the first electrode. Finally, a cathode covers the layer of electroluminescent organic material. The cathode is typically a metal or alloy and may comprise a single layer, such as aluminum, or a plurality of layers such as calcium and aluminum.

In operation, holes are injected into the device through the anode and electrons are injected into the device through the cathode. The holes and electrons combine in the organic electroluminescent layer to form excitons which then undergo radiative decay to give light (in light detecting devices this process essentially runs in reverse).

Organic light-emissive displays can provide a particularly advantageous form of electro-optic display. They are bright, colorful, fast-switching, provide a wide viewing angle and are easy and cheap to fabricate on a variety of substrates. Organic (which here includes organometallic) light-emissive displays may be fabricated using either polymers or small molecules in a range of colors (or in multi-colored displays), depending upon the materials used.

Organic light-emissive displays may be deposited on a substrate in a matrix of pixels to form a single or multi-color pixellated display. A multicolored display may be constructed using groups of red, green, and blue emitting pixels. So-called active matrix displays have a memory element, typically a storage capacitor and a transistor, associated with each pixel whilst passive matrix displays have no such memory element and instead are repetitively scanned to give the impression of a steady image.

These devices have great potential for displays. However, there are several significant problems. One is to make the device efficient, particularly as measured by its external power efficiency and its external quantum efficiency. Another is to optimize (e.g. to reduce) the voltage at which peak efficiency is obtained. Another is to stabilize the voltage characteristics of the device over time. Another is to increase the lifetime of the device.

To this end, numerous modifications have been made to the basic device structure described above in order to solve one or more of these problems.

FIG. 1 shows a vertical cross section through an example of an OLED device 100. In an active matrix display, part of the area of a pixel is occupied by associated drive circuitry (not shown in FIG. 1). The structure of the device is somewhat simplified for the purposes of illustration.

The OLED 100 comprises a substrate 102, typically 0.7 mm or 1.1 mm glass but optionally clear plastic, on which an anode layer 106 has been deposited. The anode layer typically comprises around 150 nm thickness of ITO (indium tin oxide), over which is provided a metal contact layer, typically around 500 nm of aluminum, sometimes referred to as anode metal. Glass substrates coated with ITO and contact metal may be purchased from Corning, USA. The contact metal (and optionally the ITO) is patterned as desired so that it does not obscure the display, by a conventional process of photolithography followed by etching.

A substantially transparent hole conducting layer 108a is provided over the anode metal, followed by an electroluminescent layer 108b. Banks 112 may be formed on the substrate, for example from positive or negative photoresist material, to define walls 114 into which these active organic layers may be selectively deposited, for example by a droplet deposition or inkjet printing technique. The wells thus define light emitting areas or pixels of the display.

A cathode layer 110 is then applied by, say, physical vapour deposition. The cathode layer typically comprises a low work function metal such as calcium or barium covered with a thicker, capping layer of aluminum and optionally including an additional layer immediately adjacent the electroluminescent layer, such as a layer of lithium fluoride, for improved electron energy level matching. Mutual electrical isolation of cathode lines may be achieved through the use of cathode separators (element 302 of FIG. 3b). Typically a number of displays are fabricated on a single substrate and at the end of the fabrication process the substrate is scribed, and the displays separated. An encapsulant such as a glass sheet or a metal can is utilized to inhibit oxidation and moisture ingress.

Organic LEDs of this general type may be fabricated using a range of materials including polymers, dendrimers, and so-called small molecules, to emit over a range of wavelengths at varying drive voltages and efficiencies. Examples of polymer-based OLED materials are described in WO 90/13148, WO 95/06400 and WO 99/48160; examples of dendrimer-based materials are described in WO 99/21935 and WO 02/067343; and examples of small molecule OLED materials are described in U.S. Pat. No. 4,539,507. The aforementioned polymers, dendrimers and small molecules emit light by radiative decay of singlet excitons (fluorescence). However, up to 75% of excitons are triplet excitons which normally undergo non-radiative decay. Electroluminescence by radiative decay of triplet excitons (phosphorescence) is disclosed in, for example, "Very high-efficiency green organic light-emitting devices based on electrophosphorescence" M. A. Baldo, S. Lamansky, P. E. Burrows, M. E. Thompson, and S. R. Forrest *Applied Physics Letters*, Vol. 75(1) pp. 4-6, Jul. 5, 1999." in the case of a polymer-based OLED, layers 108 comprise a hole conducting layer 108a and a light emitting polymer (LEP) electroluminescent layer 108b. The electroluminescent layer may comprise, for example, around 70 nm (dry) thickness of PPV (poly(p-phenylenevinylene)) and the hole conducting layer, which helps match the hole energy levels of the anode layer and of the electroluminescent layer, may comprise a conductive organic material, for example, around 50-200 nm, preferably around 150 nm (dry) thickness of PEDOT:PSS (polystyrene-sulphonate-doped polyethylene-dioxythiophene).

FIG. 2 shows a view from above (that is, not through the substrate) a portion of a three-color active matrix pixellated OLED display 200 after deposition of one of the active color layers. The figure shows an array of banks 112 and wells 114 defining pixels of the display.

FIG. 3a shows a view from above of a substrate 300 for inkjet printing a passive matrix OLED display. FIG. 3b shows a cross-section through the substrate of FIG. 3a along line Y-Y'.

Referring to FIGS. 3a and 3b, the substrate is provided with a plurality of cathode undercut separators 302 to separate adjacent cathode lines (which will be deposited in regions 304). A plurality of wells 308 is defined by banks 310, constructed around the perimeter of each well 308 and leaving an anode layer 306 exposed at the base of the well. The edges or faces of the banks are tapered onto the surface of the substrate as shown, heretofore at an angle of between 10 and 40 degrees. The banks present a hydrophobic surface in order that they are not wetted by the solution of deposited organic material and thus assist in containing the deposited material within a well. This is achieved by treatment of a bank material such as polyimide with an $O_2/CF_4$ plasma as disclosed in EP 0989778. Alternatively, the plasma treatment step may be avoided by use of a fluorinated material such as a fluorinated polyimide as disclosed in WO 03/083960.

As previously mentioned, the bank and separator structures may be formed from resist material, for example using a positive (or negative) resist for the banks and a negative (or positive) resist for the separators; both these resists may be based upon polyimide and spin coated onto the substrate, or a fluorinated or fluorinated-like photoresist may be employed. In the example shown the cathode separators are around 5 µm in height and approximately 20 µm wide. Banks are generally between 20 µm and 100 µm in width and in the example shown have a 4 µm taper at each edge (so that the banks are around 1 µm in height). The pixels of FIG. 3a are approximately 300 µm square but as described later, the size of a pixel can vary considerably, depending upon the intended application.

The deposition of material for organic light emitting diodes (OLEDs) using ink jet printing techniques are described in a number of documents including, for example: T. R. Hebner, C. C. Wu, D. Marcy, M. H. Lu and J. C. Sturm, "Ink-jet Printing of doped Polymers for Organic Light. Emitting Devices", *Applied Physics Letters*, Vol. 72, No. 5, pp. 519-521, 1998; Y. Yang, "Review of Recent Progress on Polymer Electroluminescent Devices," *SPIE Photonics West: Optoelectronics '98*, Conf. 3279, San Jose, January, 1998; EP O 880 303; and "Ink-Jet Printing of Polymer Light-Emitting Devices", Paul C. Duineveld, Margreet M. de Kok, Michael Buechel, Aad H. Sempel, Kees A. H. Mutsaers, Peter van de Weijer, Ivo G. J. Camps, Ton J. M. van den Biggelaar, Jan-Eric J. M. Rubingh and Eiav I. Haskal, Organic Light-Emitting Materials and Devices V, Zakya H. Kafafi, Editor, Proceedings of SPIE Vol. 4464 (2002). Ink jet techniques can be used to deposit materials for both small molecule and polymer LEDs.

A volatile solvent is generally employed to deposit organic electronic material, with 0.5% to 4% dissolved material. This can take anything between a few seconds and a few minutes to dry and results in a relatively thin film in comparison with the initial "ink" volume. Often multiple drops are deposited, preferably before drying begins, to provide sufficient thickness of dry material. Typical solvents which have been used include cyclohexylbenzene and alkylated benzenes, in particular toluene or xylene; others are described in WO 00/59267, WO 01/16251 and WO 02/18513; a solvent comprising a blend of these may also be employed. Precision ink jet printers such as machines from Litrex Corporation of California, USA are used; suitable print heads are available from Xaar of Cambridge, UK and Spectra, Inc. of NH, USA. Some particularly advantageous print strategies are described in the applicant's UK patent application number 0227778.8 filed on 28 Nov. 2002 and the applicant's PCT patent application WO 2004/049466 filed on 18 Nov. 2003.

Inkjet printing has many advantages for the deposition of materials for molecular electronic devices but there are also some drawbacks associated with the technique. As previously mentioned the photoresist banks defining the wells may be tapered to form a shallow angle, typically around 15°, with substrate. However it has been found that dissolved organic electronic material deposited into a well with shallow edges dries to form a film with a relatively thin edge. FIGS. 4a and 4b illustrate this process.

FIG. 4a shows a simplified cross section 400 through a well 308 filled with dissolved material 402, and FIG. 4b shows the same well after the material has dried to form a solid film 404. In this example the bank angle is approximately 15° and the bank height is approximately 1.5 µm. As can be seen a well is generally filled until it is brimming over. The solution 402 has a contact angle $\theta_c$ with the plasma treated bank material of typically between 30° and 40° for example around 35°; this is the angle the surface of the dissolved material 402 makes with the (bank) material it contacts, for example angle 402a in FIG. 4a. As the solvent evaporates the solution becomes more concentrated and the surface of the solution moves down the tapering face of a bank towards the substrate; pinning of the drying edge can occur at a point between the initially landed wet edge and the foot of the bank (base of the well) on the substrate. The result, shown in FIG. 4b, is that the film of dry material 404 can be very thin, for example of the order of 10 nm or less, in a region 404a where it meets the face of a bank. When such a film is driven, only these thin outer portions emit light. This is due to the fact that the thinner areas have a lower resistance. As such, the current tends to flow only through these low resistance areas.

In practice drying is complicated by other effects such as the coffee ring-effect. With this effect because the thickness of solution is less at the edge of a drop than in the centre, as the edge dries the concentration of dissolved material there increases. Because the edge tends to be pinned solution then flows from the centre of the drop towards the edge to reduce the concentration gradient. This effect can result in dissolved material tending to be deposited in a ring rather than uniformly. In the situation where the central portion is thin and the outer ring is thick, then stronger emission will occur in the central portion. Driving a larger current through a smaller area results in a less efficient device.

The physics of the interactions of a drying solution with a surface are extremely complicated and a complete theory still awaits development.

Another drawback of banks with a long-shallow taper is that an inkjet droplet that does not fall exactly into a well but instead lands in part on the slope of the bank can dry in place, resulting in non-uniformities in the end display.

One solution to the aforementioned problems is to modify the bank structure as described in the present applicant's earlier application GB-A-0402559.9.

Another problem associated with ink jet printing of organic opto-electrical devices such as those discussed above is that in the resultant device, the organic hole injecting layer can extend beyond the overlying organic semi-conductive layer providing a shorting path between the cathode and the anode at an edge of the well.

One solution to the aforementioned problem is to modify the bank structure by, for example, providing a stepped bank structure which increases the length of the shorting path, thus increasing the resistance of the path resulting in less shorting. Such a solution has been proposed by Seiko Epson. However, providing a more complex bank structure is expensive and increases the complexity of the manufacturing method for the device.

The feasibility of using ink jet printing to define hole conduction and electroluminescent layers in OLED display has been well demonstrated. The particular motivation for ink jet printing has been driven by the prospect of developing scalable and adaptable manufacturing processes, enabling large substrate sizes to be processed, without the requirement for expensive product specific tooling.

The last five years have seen an increasing activity in the development of ink jet printing for depositing electronic materials. In particular there have been demonstrations of ink jet printing of both hole conduction (HC) and electroluminescent (EL) layers of OLED devices by more than a dozen display manufacturers. A number of these companies have set up pilot production facilities and have indicated that mass manufacture will start in 2007-2008 timeframe [M. Fleuster, M. Klein, P. v. Roosmalen, A. de Wit, H. Schwab. Mass Manufacturing of Full Colour Passive Matrix and Active Matrix PLED Displays. SID Proceedings 2004, 4.2].

The key reasons for the interest in ink jet printing are scalability and adaptability. The former allows arbitrarily large sized substrates to be patterned and the latter should mean that there are negligible tooling costs associated with changing from one product to another since the image of dots printed on a substrate is defined by software. At first sight this would be similar to printing a graphic image—commercial print equipment is available that allow printing of arbitrary images on billboard sized substrates [Inca digital website: http://www.incadigital.com/]. However the significant difference between graphics printers and display panels is the former use substrates that are porous or use inks that are UV curable resulting in very little effect of the drying environment on film formation. In comparison, the inks used in fabricating OLED displays are ink jet printed onto non-porous surfaces and the process of changing from a wet ink to dry film is dominated by the drying environment of the ink in the pixel. Since the printing process involves printing stripes (or swathes) of ink (corresponding to the ink jet head width) there is an inbuilt asymmetry in the drying environment. In addition OLED devices require the films to be uniform to nanometer tolerance. It follows that to achieve scalability and adaptability requires control of the film forming properties of the ink and a robustness of this process to changes in pixel dimensions and swathe timing. In this application it is demonstrated how this can be achieved with suitable ink engineering.

In general terms, the behavior of drying drops of HC and EL inks is explained by the coffee-ring effect first modeled by Deegan [R. D. Deegan, O. Bakajin, T. F. Dupont, G. Huber, S. R. Nagel, and T. A. Witten. Capillary flow as the cause of ring stains from dried liquid drops. Nature 389, 827 (1997)]. For the case of circular pixels the wet ink forms a section of a sphere, where the angle made by the drop surface with the substrate is the contact angle. When pinning occurs (which it invariably does for the inks and surfaces used in polymer OLED display manufacturing) the drying drop maintains its diameter and solute is carried to the edges of the drop forming a ring of material at the outer edges of the pixel. The amount of material carried to the edge depends on a number of factors—in particular how long the process of material transfer can occur before the drying drop gels and the uniformity of the drying environment. At a swathe edge more drying occurs on the unprinted side since the solvent concentration in the atmosphere above the substrate is less that the printed side. With more evaporation taking place on the unprinted side more solute is deposited on this side and the film profile becomes asymmetric.

The aforementioned problems are addressed in the applicant's earlier GB patent application no. 0510382.5 filed on 20 May 2005 by adapting compositions for ink jet printing comprising conductive or semi-conductive organic material. These adapted compositions are of particular use in the manufacture of light-emissive displays and produce films having an even thickness. A more uniform film morphology produces a more uniform emission in the finished device. However, it can be difficult and time consuming to design a suitable ink in order to produce sufficiently flat films for high quality light-emissive displays.

To summarize the previous discussion of the background to the invention, various problems are caused by non-uniform film formation in light-emissive displays. This is a particular problem when using ink jet printing of organic materials, although the problem also exists to a greater or lesser extent using other deposition techniques. Accordingly, a large amount of work has been carried out in order to try and achieve more even films by either modifying the structure of the ink wells and/or by modifying the composition of the inks. One problem with both these approaches is that the complex ink formulations, bank structures and deposition techniques required to achieve flat film formation can be difficult and expensive to manufacture. Furthermore, for each new material, such as a new electroluminescent polymer, the ink composition and/or bank structure is required to be modified in order to achieve optimal film formation and this is very time consuming and costly. Also, after an ink composition has been optimized for producing the best performance characteristics (e.g. electrical and optical properties), it may be difficult to modify the composition for obtaining optimal film formation without detrimentally affecting the performance characteristics. In light of these problems there is an on going need to provide new solutions to the problem of uneven film formation in light-emissive devices.

EP 0788014, EP 0949603, U.S. Pat. No. 6,020,869 and WO 99/42983 disclose light-emissive displays in which the pixels, or a sub-pixels, are split into a plurality of smaller discrete light emissive regions for improving grey-scale, each discrete light-emissive region having a single anode and a single cathode associated therewith. Multiple sub-pixels, e.g. three red sub-pixels, also provide degeneracy such that if one sub-pixel fails, the others can still function. However, the provision of multiple sub-pixels results in a lower aperture ratio causing a reduction in the lifetime of the display (the aperture ratio is the proportion of the actual emitting area to the total area of pixel, and the smaller the actual emitting area the harder it must be driven thus reducing lifetime). Furthermore, each discrete light-emissive region has the aforementioned problems of non-uniform film formation.

In light of these problems there is an ongoing need to provide new solutions to the problem of providing improved grey scale and degeneracy while retaining a high aperture ratio and lifetime for the display.

Another prior art display is shown in FIG. 5 and comprises parallel strips of red, green and blue emissive material (R, G, B) sandwiched between cathodes (C) running parallel to the strips of emissive material and anodes (A) running perpendicular to the emissive strips. Each strip of emissive material has one cathode and a plurality of anodes associated therewith. Each pixel has one anode and three cathodes associated therewith to form three discrete emissive regions (red, green and blue sub-pixels). Each sub-pixel has one cathode and one anode associated therewith. Each discrete light-emissive region suffers from the aforementioned problems of film non-uniformity and the sub-pixels do not have any degeneracy and may have poor grey-scale.

Embodiments of the invention seek to solve the aforementioned problems without having to design a suitable ink and a suitable bank structure in order to achieve flat film formation within a discrete emissive region of a pixel or sub-pixel.

Furthermore, embodiments of the invention seek to solve the aforementioned problems of providing degeneracy and/or improved grey scale without significantly reducing the aperture ratio of the display.

SUMMARY

According to a first aspect of the invention there is provided a light-emissive display comprising: a substrate; a first electrode layer disposed over the substrate; a light-emissive layer disposed over the first electrode layer; and a second electrode layer disposed over the light-emissive layer, wherein the light-emissive layer is patterned providing a plurality of discrete light-emissive regions, each discrete light-emissive region being a pixel, or a sub-pixel, of the light-emissive display, and wherein the first electrode layer and/or the second electrode layer comprises a plurality of electrodes, each electrode comprising at least two sub-electrodes associated with each discrete light-emissive region.

Usually, each pixel of a monochromatic display will have a single discrete light-emissive region. In this case, according to the invention at least two sub-electrodes will be associated with each pixel.

Usually, each pixel of a full-color display will comprising a plurality of discrete light-emissive regions of different color forming sub-pixels. In this case, according to the invention at least two sub-electrodes will be associated with each sub-pixel.

By "discrete light-emissive region" we mean a continuous region of light emissive material rather than a plurality of light-emissive regions. By continuous region, we mean continuous in the plane of the display. A discrete light-emissive region may comprise a number of layers, one on top of the other, in a direction perpendicular to the plane of the display. However, if such layers are continuous in the plane of the display then they would constitute a discrete light-emissive region. As previously stated, a discrete light-emissive region, will usually correspond to a pixel in a monochromatic display or a sub-pixel in a full color display.

The provision of at least two sub-electrodes associated with each discrete light-emissive region allows areas of the discrete light-emissive region to be differentially driven. This could be to balance current flow in a non-flat light-emissive region or for adjusting the viewing angle range when used in conjunction with a lens in a standard or 3D display.

Furthermore, if there is an electrical short in one area of the discrete light-emissive region then the remaining areas may be driven in preference to the shorted area. Thus, the whole pixel (or sub-pixel) is not lost. Accordingly, the pixel yield (that is, the number of pixels which are functional in a manufactured display) is improved. Advantageously, a short-detecting means is provided in the drive circuitry of the display. When a short is detected the sub-electrode associated therewith is no longer driven and instead the other sub-electrode(s) associated with the discrete light emissive region is (are) driven harder to compensate for the lost area.

The invention will increase the aperture ratio because more of the pixel is being driven. This will increase efficiency and also increase the lifetime of the display. Furthermore, degeneracy is provided without having to provide multiple discrete light-emissive regions which reduces the aperture ratio.

The sub-electrodes may be utilized to increase grey scale. The brightness of a pixel or sub-pixel can be controlled by making use of the fact that the separate sub-electrodes can be individually controlled. The brightness of the pixel or sub-pixel can thus be controlled by switching on one or more of the light-emitting areas associated with each sub-electrode. This will increase the number of grey-scale values producing a better quality display without losing aperture ratio. To achieve even more grey-scale values the aforementioned drive method may be combined with a pulsed drive scheme such as that described in WO 99/42983. This could also be combined with voltage control such that the voltage applied to each sub-electrode is varied to a level that is not fully on or off, to give even more available grey-scale values.

Preferably, the light-emissive display further comprises drive circuitry capable of driving said at least two sub-electrodes at a different voltage.

In one embodiment, the drive circuitry is adapted to drive said at least two sub-electrodes at the same current per unit area.

In a preferred embodiment the light-emissive layer is patterned by providing a bank structure disposed over the first electrode layer defining a plurality of wells, each well containing one of the discrete light-emissive regions, whereby at least two of the sub-electrodes are associated with each well.

Preferably, the first electrode layer comprises said plurality of electrodes with at least two of the sub-electrodes being associated with each discrete light-emissive region. Preferably, the first electrode is the anode. The anode may be any suitable material but is preferably ITO.

Preferably, the light-emissive layer comprises an organic light-emissive material. More preferably still, the light-emissive layer comprises a polymer light-emissive material.

Preferably, a conductive polymer layer is disposed between the first electrode layer and the light-emissive layer. This layer may be any suitable material but is preferably PEDOT-PSS.

Preferably, at least one of the conductive polymer layer and the light-emissive layer is deposited by ink jet printing.

The two sub-electrodes can be driven independently. Alternatively, the two sub-electrodes can be driven by a single driver, with a passive resistive component provided in series with one of the sub-electrodes in order to compensate for different thicknesses in the light-emissive region. Examples of resistive components include resistors and diodes. A combination of passive components may be provided.

In one arrangement for an active matrix display, a single driver and TFT is provided having two or more outputs connected to the sub-electrodes, the sub-electrodes being driven at the same current per unit area.

Embodiments of the invention allow the current per unit area to be equalized across the discrete light-emissive region. When different areas of the light-emissive region have different thicknesses, they have different resistances, and thus need to be driven at different voltages in order to have the same current per unit area.

If the material of the sub-electrodes is of a low enough conductivity so as to make lateral conduction negligible, then no gap need be provided between the sub-electrodes. For example, sub-electrodes could be made of a thin layer of material in order to increase lateral resistance and reduce lateral conduction thus negating the requirement for a gap between the sub-electrodes. However, in this case, additional conductive connecting lines will usually be required, particularly for a passive matrix display, as otherwise the resistance across the display will generally be too high. This is not such a problem for active matrix displays in which each discrete light-emissive region will have its own driver.

For example, in passive matrix displays an ITO anode of typically 150 nm thickness is used in standard devices. A thinner layer may be used in accordance with embodiments of the invention in order to avoid lateral conduction between sub-electrodes, e.g. ½ or ¼ of this thickness. In this case, a more conductive connecting line must be provided. In active matrix displays, an ITO anode of this lower thickness can be utilized as the distance between the drivers and the pixels is small.

If a short is detected, it is possible to laser ablate the connection to the sub-electrode associated with the short. Alternatively, self-ablation of the connection may be achieved by a hard-drive step to break the connection.

In embodiments of the invention, the sub-electrodes are connected to a conductive connecting line via a resistive connection which may be provided by, for example, a thin portion of the electrode material. Providing a resistant connection between the common conductor line and the sub-electrodes gives a "soft" electrical connection so if there is a short the whole line of pixels in the display will not be lost.

Alternatively, a gap may be provided between the sub-electrodes. This gap may be filed with an insulating material in order to planarize the upper surface of the anode. Examples of suitable planarizing, insulating materials include dielectrics such as silicon dioxide or a photoresist. It is advantageous for the planarizing, insulating material to have similar wetting properties to the material of the sub-electrodes for the material deposited thereover. Furthermore, it is advantageous to select a planarizing, insulating material which won't be etched away when patterning the bank material. As an alternative to providing a planarizing, insulating material, the gap between sub-electrodes may be made sufficiently small that the material deposited thereover can span the gap. If the electrode layer is thin then there is less or no need to planarize the layer.

It is advantageous for the electrode layer to have a constant thickness in order to prevent non-uniformities in the overlying layers.

In one arrangement, the electrode layer comprising the sub-electrodes comprises two layers, a patterned conductive contact layer defining the sub-electrodes with a uniform layer of charge injecting material thereover. For example, a patterned metal contact layer may be provided with a uniform layer of ITO deposited thereover. The charge injecting material must be of low enough conductance so as to prevent lateral conduction. This may be achieved, for example, by providing a relatively thin layer of ITO as the charge injecting layer.

Embodiments of the invention are particularly useful for forming large area displays as the problem of non-uniformity in the emissive film is most evident for large pixels (approximately 500 micrometers).

Preferably two sub-electrodes are provided for each discrete emissive region. However, more that two sub-electrodes may be provided particularly if the discrete emissive region are large. For example, 5 or 6 sub-electrodes may be provided for 1 mm pixels in a large area display in order for the current per unit area to be equalized across the discrete light-emissive region.

Preferably, the thickness of the organic layers is substantially constant within each area associated with a sub-electrode.

The electrode layer may be patterned by standard photolithography. However, any patterning techniques can be used including, for example, laser ablation, e-beam ablation, dry etching, and wet etching. Furthermore, the patterning method need not be subtractive and direct writing techniques can be employed such as ink jet printing.

A ring shaped first sub-electrode (e.g. annular) surrounding a central second sub-electrode (e.g. substantially circular or oval) may be advantageous for differentially driving an outer peripheral zone of a discrete light-emissive region compared to an inner central zone. One problem with such an arrangement is that of providing a suitable connection to the second sub-electrode if it is completely surrounded by the first sub-electrode. Accordingly, it may be advantageous to provide a first sub-electrode which does not form a complete ring such that one or more openings are provided for connecting the second sub-electrode.

The shape of the discrete light-emissive region will depend on the drying regime, the wettability of the underlying surface and the composition of the ink.

According to another aspect of the invention there is provided a method of manufacturing a light-emissive display comprising: providing a substrate; depositing a first electrode layer over the substrate; depositing a light-emissive layer over the first electrode layer; and depositing a second electrode layer over the light-emissive layer, wherein the light-emissive layer is patterned providing a plurality of discrete light-emissive regions, each discrete light-emissive region being a pixel, or a sub-pixel, of the light-emissive display, and wherein the first electrode layer and/or the second electrode layer comprises a plurality of electrodes, each electrode comprising at least two sub-electrodes associated with each discrete light-emissive region.

In a preferred embodiment the light-emissive layer is patterned by depositing a bank structure disposed over the first electrode layer defining a plurality of wells prior to depositing the light-emissive layer, the light-emissive layer being subsequently deposited such that each well contains one of the discrete light-emissive regions, whereby at least two of said plurality of electrodes are associated with each well.

Preferably, the light-emissive layer is an organic light-emissive layer, preferably comprising a polymer light-emissive material. Preferably, a conductive polymer layer is disposed between the first electrode layer and the light-emissive layer.

Preferably, at least one of the conductive polymer layer and the light-emissive layer is deposited by ink jet printing. Primarily, embodiments of the invention are useful for ink jet printed displays because of the problems involved in achieving flat films using ink jet printing. However, it is envisaged that embodiments of the invention may also be useful when using other deposition techniques.

BRIEF DESCRIPTION OF THE DRAWINGS

Embodiments of the invention will now be described, by way of example only, with reference to the accompanying drawings in which.

DETAILED DESCRIPTION

Figure 1:
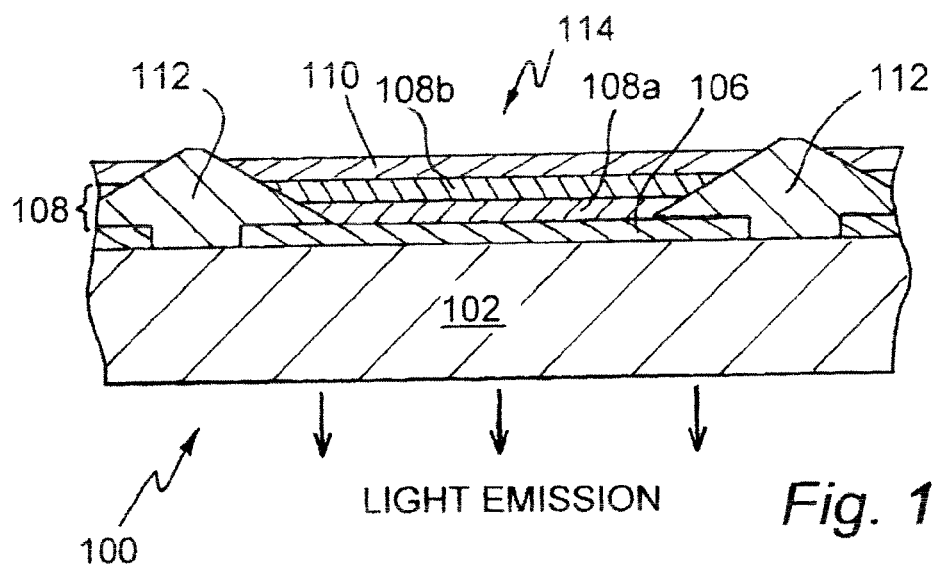
FIG. 1 shows a vertical cross section through an example of an OLED device.
Figure 2:
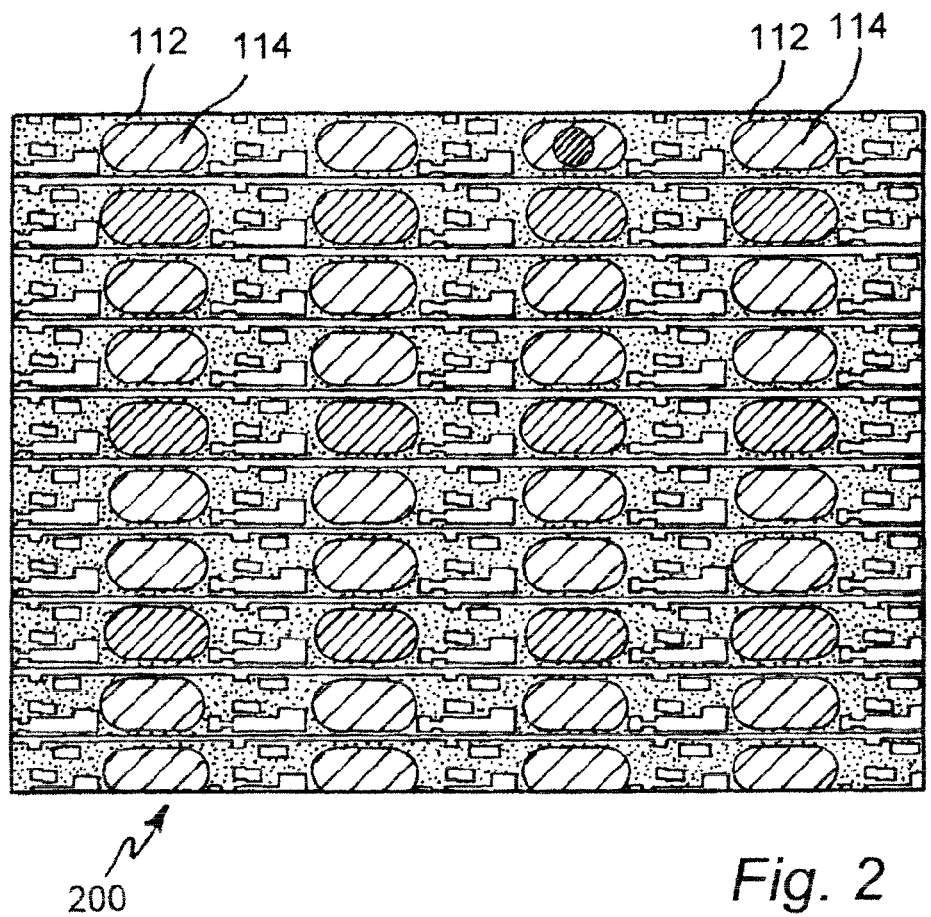
FIG. 2 shows a view from above of a portion of a three-color pixelated OLED display.
Figure 3A:
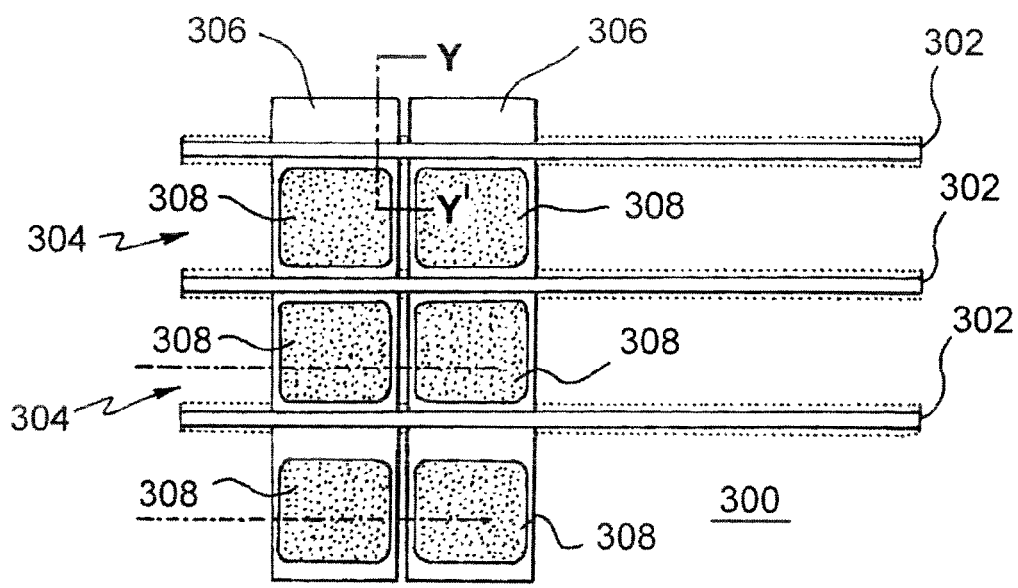
FIGS. 3a and 3b show a view from above and a cross-sectional view respectively of a passive matrix OLED display.
Figure 3B:
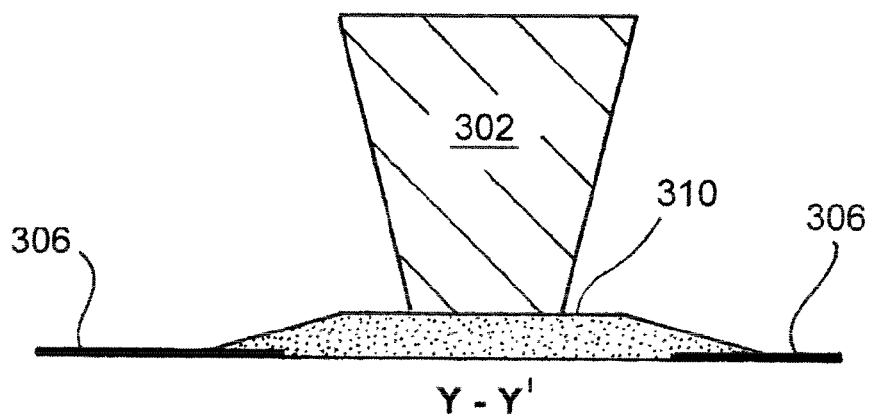
Figure 4A:
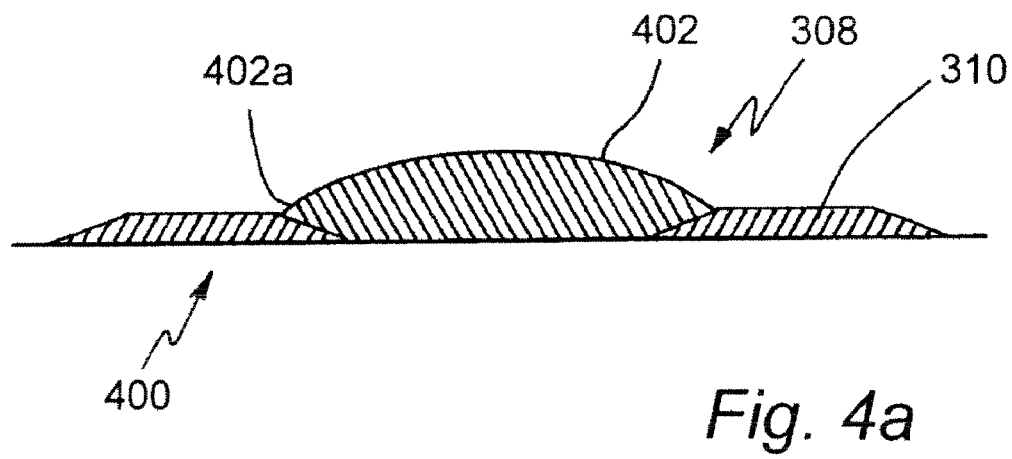
FIGS. 4a and 4b show a simplified cross section of a well of an OLED display substrate filled with, respectively, dissolved material, and dry material.
Figure 4B:
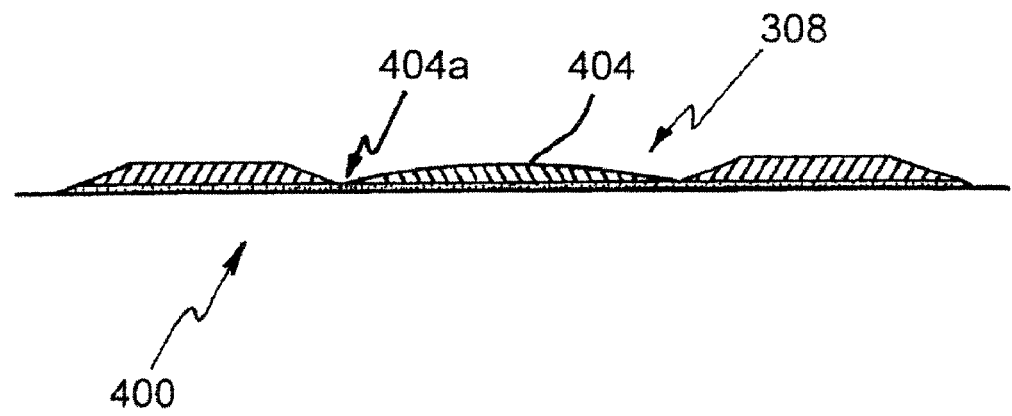
Figure 5:
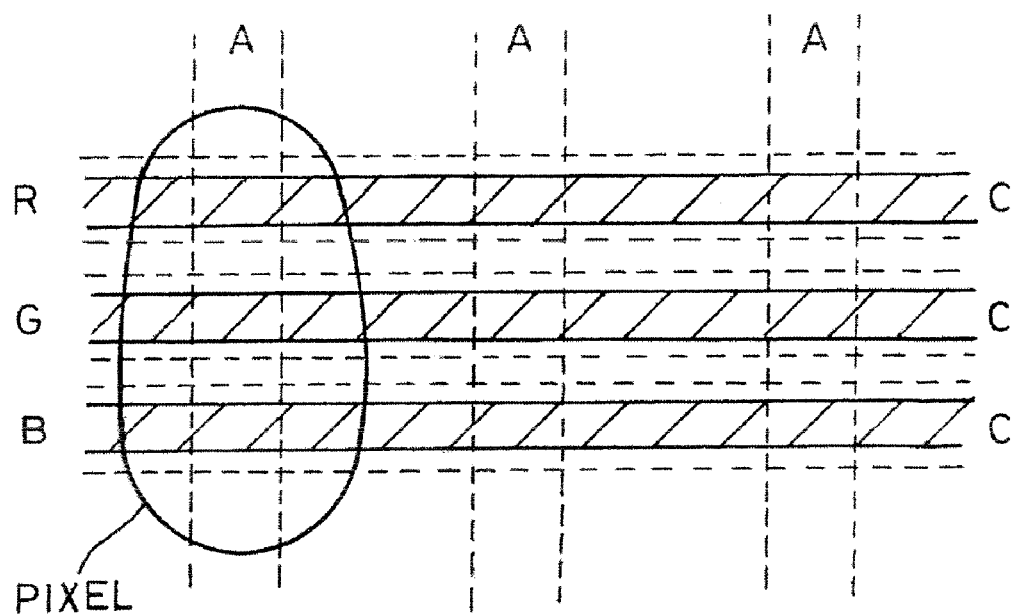
FIG. 5 shows a prior art display comprising strips of red, green, and blue emissive material.
Figure 6:
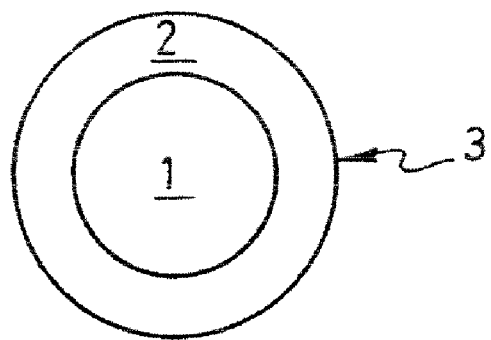
FIG. 6 shows a plan view of an electrode comprising two sub-electrodes in accordance with an embodiment of the invention.
Figure 7:
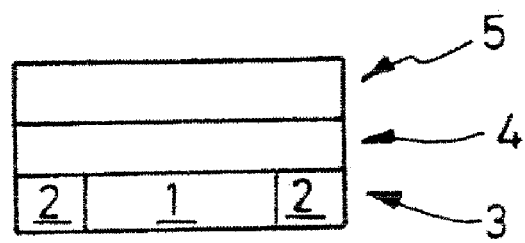
FIG. 7 shows a cross-sectional view of a pixel (or sub-pixel) comprising the electrode shown in FIG. 6.

FIG. 6 shows a plan view of an electrode 3 comprising two sub-electrodes 1, 2 in accordance with an embodiment of the invention. The electrode 3 comprises a ring shaped sub-electrode 2 surrounding a circular sub-electrode 1 for differentially driving an outer peripheral zone of a discrete light-emissive region compared to an inner central zone. FIG. 7 shows a cross-sectional view of a pixel (or sub-pixel) comprising the electrode shown in FIG. 6. The pixel (or sub-pixel) comprises an anode 3, a light-emissive layer 4 disposed over the anode, and a cathode 5 disposed over the light-emissive layer.

Figure 8:
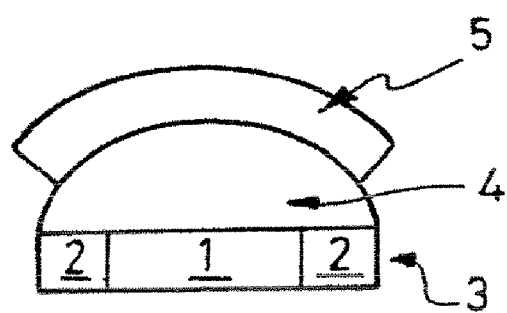
FIG. 8 shows a cross-sectional view of a pixel (or sub-pixel) comprising the electrode shown in FIG. 6, in which the light-emissive layer has a dome shaped profile.

In practice, the light-emissive layer may not have a uniform thickness. Ink jet printed light-emissive layers are often domed or have a "coffee ring" shape. FIG. 8 shows a cross-sectional view of a pixel (or sub-pixel) comprising the electrode shown in FIG. 6, in which the light-emissive layer has a dome shaped profile having a thick centre circled by a thinner ring. Under normal driving conditions (using a single anode and cathode) only the thinner ring would light up. However, utilizing the anode arrangement shown the central portion can be driven at a higher voltage than the outer ring such that the current per unit area flowing through both areas is substantially the same.

Figure 9:
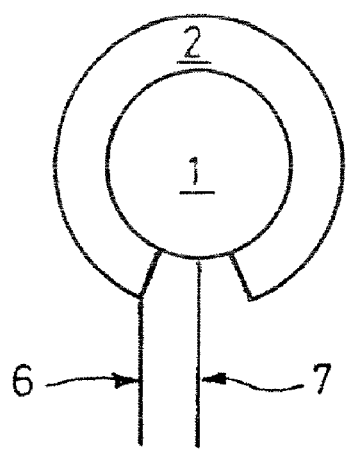
FIG. 9 shows a plan view of an electrode comprising two sub-electrodes in accordance with another embodiment of the invention.

One problem with the anode arrangement illustrated in FIGS. 6 to 8 is that of providing a suitable connection to the central sub-electrode when it is completely surrounded by the outer sub-electrode. The connection to the central sub-electrode must be made from above or below, e.g. through the substrate on which the anode is disposed. Accordingly, it may be advantageous to provide an outer sub-electrode which does not form a complete ring such that one or more openings are provided for connecting the inner sub-electrode. FIG. 9 shows a plan view of such an arrangement illustrating connecting lines 6 and 7 for the outer and inner sub-electrodes, respectively.

Figure 10:
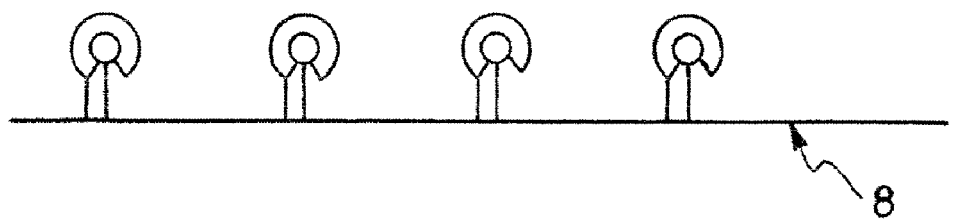
FIG. 10 shows electrodes of FIG. 9 connected to a common conductive line.
Figure 11:
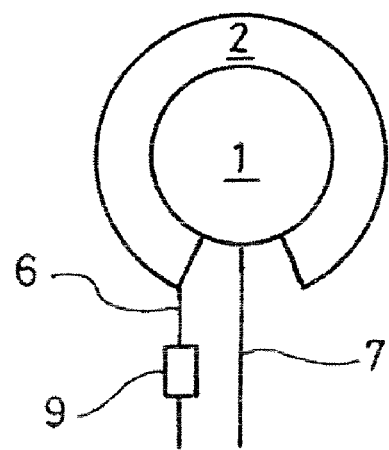
FIG. 11 shows an electrode arrangement in accordance with another embodiment of the invention with a resistor connected in series with one of the sub-electrodes.

As stated in the summary of invention section, in a passive matrix display, it may be advantageous to provide conductive lines for rows (or columns) of the display, with patterned electrodes defining the sub-electrodes being connected along the conductive lines in order to drive the pixels (or sub-pixels). FIG. 10 shows one such common conductive line 8 having electrodes of the structure shown in FIG. 9 connected thereto. A driver (not shown) is connected to an end of the conductive line. In order to provide a differential drive voltage for the sub-electrodes, a resistor may be placed in series with one of the sub-electrodes. Such an arrangement is shown in FIG. 11 in which a resistor 9 is provided in series with the outer sub-electrode in order to compensate for the lower resistance in the outer portion of a dome shaped emissive region. For a coffee ring shaped emissive region the resistor would be required on the connection 7 to the inner sub-electrode. In one embodiment, a resistive component may be provided on both connections 6 and 7, the resistive components being controllable in order to deliver the same current per unit area across the light-emissive region.

Figure 12:
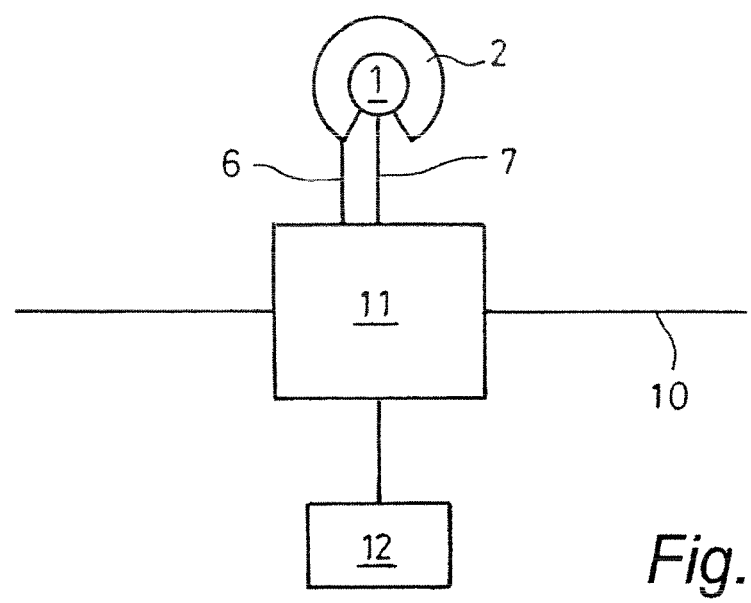
FIG. 12 shows an active matrix display element comprising a driver, a TFT, and an electrode as shown in FIGS. 9 to 11.

FIG. 12 shows an active matrix display element comprising a driver 12, a TFT 11, and an electrode having sub-electrodes 1, 2 connected to the TFT via connections 6, 7. A signal line 10 is connected to the TFT. In operation, a signal is sent along the signal line 10 from a controller (not shown), the signal containing information regarding the state of the pixel (or sub-pixel). For example, the controller may send a signal to turn on the pixel at a certain brightness for a certain length of time. The TFT 11 then switches the pixel on, and is driven by the driver 12 for the period of time and brightness specified in the signal from the controller. In a preferred embodiment the TFT 11 is arranged to provide the same current per unit area through the two sub-electrodes 1, 2 via connections 6, 7 (usually from the drain of the TFT). Thus, the current per unit area through the central and peripheral portions of the pixel will be the same and the central and peripheral portions of the pixel will emit at the same brightness.

If a short is detected in, for example, a peripheral region of the pixel, then the controller and the TFT can be arranged to only drive the central sub-electrode in order that the whole pixel is not lost. In this case, the central portion must be driven harder to attain the same brightness as would have been achieved if both sub-electrodes were being driven.

Figure 13:
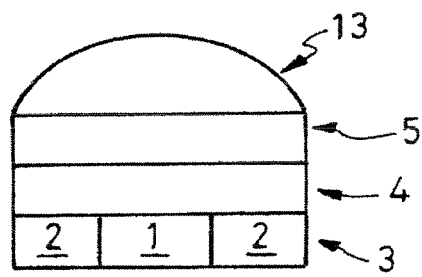
FIG. 13 shows a pixel (or sub-pixel) according to another embodiment of the invention comprising a lens.

FIG. 13 shows a pixel (or sub-pixel) according to another embodiment of the invention comprising a lens 13. The lens serves the dual roles of increasing light output and reducing viewing angle when only a primary central area of a sub-pixel is driven. When others wish to view the display content then an outer secondary area can be activated to temporarily widen the viewing angle. This can act as both a privacy feature and to reduce power consumption for a portable device. The lens is shown on top of the cathode in the schematic diagram shown in FIG. 13. However, in practice, the lens is most likely to be placed on an encapsulating layer.

The previously described examples refer to annular patterned electrodes. Of course, this may not be the case and some other layout might be desirable. Many alternative layouts could be provided.

Figure 14:
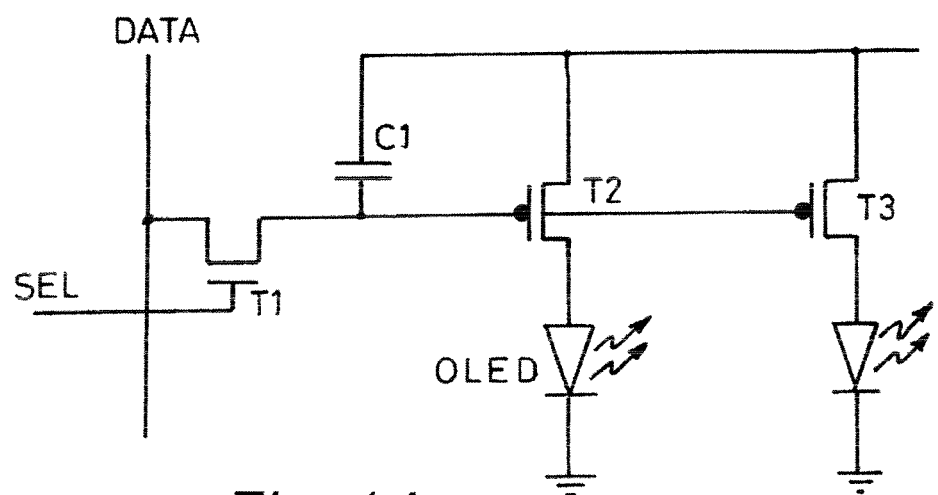
FIG. 14 shows an active matrix drive circuit for use with the invention.

Referring to FIG. 14, an active matrix drive circuit for use with the invention comprises a select line SEL connected to a gate of a switching transistor T1 and a data line DATA connected to the source of the switching transistor T1 as is known in the art. As is also known in the art, a capacitor C1 comprises a first terminal connected between a drain of the switching transistor T1 and a gate of a first drive transistor T2 and a second terminal connected to a source of the first drive transistor T2. The first drive transistor T2 comprises a drain terminal connected to an anode terminal of a light emitting device such as an organic light emitting device, which has a cathode terminal connected to ground. As will be appreciated by a person skilled in the art, many other active matrix circuit variations are well known.

In order to provide an electrode with at least two sub-electrodes according to the invention, a second drive transistor T3 is provided as illustrated in FIG. 14. The second drive transistor T3 is connected in parallel to the first drive transistor T2 and in effect can be represented by being also connected to a light emitting device. As will be appreciated by a person skilled in the art, as many additional driving transistors TN may be provided as required.

Since the width of the drain terminal of each driving transistor T2, T3 is proportional to the driving current, the width is scaled to the area of the sub-pixel to be driven. For example, if the first transistor T2 is provided to drive a larger area of sub-pixel than the second drive transistor T3, it will be provided with a larger width of drain terminal so that a larger driving current is generated when in operation. The ratio of drive current to width of the drain terminal for the first and second drive transistors T2, T3 can be expressed in the following relationship where I is a driving current and W is a width of the drain terminal: $I_{T2}/W_{T2}=I_{T3}/W_{T3}$.

It will be understood that the invention is not limited to the described embodiments and encompasses modifications apparent to those skilled in the art lying within the spirit and scope of the claims appended hereto.

What is claimed:

1. A light-emissive display comprising: a substrate; a first electrode layer disposed over the substrate; a light-emissive layer disposed over the first electrode layer; and a second electrode layer disposed over the light-emissive layer, wherein the light-emissive layer is patterned to provide a plurality of discrete light-emissive regions, each discrete light-emissive region being a pixel, or a sub-pixel, of the light-emissive display, and wherein the first electrode layer and/or the second electrode layer comprises a plurality of electrodes, each electrode comprising at least two sub-electrodes associated with each discrete light-emissive region.

2. A light-emissive display according to claim 1, wherein the display is a monochromatic display and each discrete light-emissive region constitutes a pixel of the display.

3. A light-emissive display according to claim 1, wherein the display is a multicolor display and each discrete light-emissive region constitutes a sub-pixel of the display.

4. A light-emissive display according to claim 1, wherein the light-emissive display further comprises drive circuitry capable of driving said sub-electrodes at different voltages.

5. A light-emissive display according to claim 4, wherein the drive circuitry is adapted to drive said sub-electrodes at the same current density.

6. A light-emissive display according to claim 4, the drive circuitry being arranged whereby said sub-electrodes can be driven independently by separate drivers.

7. A light-emissive display according to claim 4, the drive circuitry being arranged whereby said sub-electrodes are driven by a single driver connected to said sub-electrodes, an active or passive component being provided between the single driver and at least one of said sub-electrodes in order to provide different drive voltages to said sub-electrodes.

8. A light-emissive display according to claim 7, wherein said active or passive component is a passive resistive component provided in series with at least one of said sub-electrodes in order to provide different drive voltages to said sub-electrodes.

9. A light-emissive display according to claim 8, wherein the passive resistive component is a resistor, a diode, or a combination thereof.

10. A light-emissive display according to claim 8, wherein the display is a passive matrix display, each row or column of pixels, or sub-pixels, having a common conductive line, said sub-electrodes being connected to said common conductive line by connectors, at least one connector comprising the passive resistive component.

11. A light-emissive display according to claim 7, wherein the display is an active matrix display, each pixel, or sub-pixel, having an active switching component associated therewith in order to provide different drive voltages to said sub-electrodes.

12. A light-emissive display according to claim 11, wherein said active switching component comprises a driver and a thin film transistor having an output connected to each of said sub-electrodes, the driver and thin film transistor being arranged to drive the sub-electrodes at substantially equal current densities.

13. A light-emissive display according to claim 1, wherein a gap is provided between said sub-electrodes for preventing lateral conduction between the sub-electrodes.

14. A light-emissive display according to claim 13, wherein said gap is filled with an insulating material in order to planarize an upper surface of the electrodes.

15. A light-emissive display according to claim 14, wherein said insulating material is an inorganic dielectric material or an organic photoresist material.

16. A light-emissive display according to claim 1, wherein said sub-electrodes comprise a patterned layer of conductive material and an unpatterned layer of conductive material, said unpatterned layer being less conductive than said patterned layer for preventing lateral conduction between the sub-electrodes.

17. A light-emissive display according to claim 16, wherein the patterned layer comprises a patterned conductive contact layer defining the sub-electrodes and the unpatterned layer comprises a uniform layer of charge injecting material.

18. A light-emissive display according to claim 1, wherein the light-emissive layer is patterned by providing a bank structure disposed over the first electrode layer defining a plurality of wells, each well containing one of the discrete light-emissive regions, whereby at least two sub-electrodes are associated with each well.

19. A light-emissive display according to claim 1, wherein the first electrode layer comprises the sub-electrodes.

20. A light-emissive display according to claim 1, wherein the sub-electrodes are anodes.

21. A light-emissive display according to claim 1, wherein the light-emissive layer comprises an organic light-emissive material.

22. A light-emissive display according to claim 21, wherein the light-emissive layer comprises a polymer light-emissive material.

23. A light-emissive display according to claim 1, wherein a conductive polymer layer is disposed between one of the electrode layers and the light-emissive layer.

24. A light-emissive display according to claim 1, wherein the sub-electrodes comprise a ring shaped first sub-electrode surrounding a central second sub-electrode for differentially driving an outer peripheral zone of the discrete light-emissive region with respect to an inner central zone of the discrete light-emissive region.

25. A light-emissive display according to claim 24, wherein the first sub-electrode does not form a complete ring such that one or more openings are provided for connecting the second sub-electrode.

26. A method of manufacturing a light-emissive display comprising: providing a substrate; depositing a first electrode layer over the substrate; depositing a light-emissive layer over the first electrode layer; patterning the light-emissive layer to provide a plurality of discrete light-emissive regions; and depositing a second electrode layer over the light-emissive layer, wherein each discrete light-emissive region is a pixel, or a sub-pixel, of the light-emissive display, and wherein the first electrode layer and/or the second electrode layer comprises a plurality of electrodes, each electrode comprising at least two sub-electrodes associated with each discrete light-emissive region.

27. A method according to claim 26, wherein the patterning of the light-emissive layer is performed by depositing a bank structure over the first electrode layer to define a plurality of wells, the light-emissive layer being subsequently deposited such that each well contains one of the discrete light-emissive regions, whereby at least two sub-electrodes are associated with each well.

28. A method according to claim 26, wherein the depositing of the light-emissive material is performed by ink jet printing.

29. A method according to claim 26, wherein the light-emissive layer comprises an organic light-emissive material.

30. A method according to claim 29, wherein the light-emissive layer comprises a polymer light-emissive material.

31. A method according to claim 26, further comprising depositing a conductive polymer layer between one of the electrode layers and the light-emissive layer.

32. A method according to claim 31, wherein the conductive polymer layer is deposited by ink jet printing.

33. A method according to claim 26, further comprising patterning one of the first and second electrode layers by laser ablation, e-beam ablation, dry etching, wet etching, or direct writing in order to form the sub-electrodes.

* * * * *

UNITED STATES PATENT AND TRADEMARK OFFICE
CERTIFICATE OF CORRECTION

PATENT NO. : 7,948,162 B2
APPLICATION NO. : 11/734248
DATED : May 24, 2011
INVENTOR(S) : Euan C. Smith Page 1 of 1

It is certified that error appears in the above-identified patent and that said Letters Patent is hereby corrected as shown below:

On the Cover Page:

At field (75), "Longstanton" should be -- Cambridgeshire --.

In the Specification:

At Column 6, line 40, "on going" should be -- ongoing --.

At Column 6, line 45, "a sub-pixels" should be -- sub-pixels --.

At Column 7, line 35, "comprising" should be -- comprise --.

At Column 7, line 48, "region," should be -- region --.

At Column 8, line 5, "reduces" should be -- reduce --.

At Column 9, line 62, "that" should be -- than --.

At Column 9, line 64, "are" should be -- is --.

Signed and Sealed this
Twelfth Day of February, 2013

Teresa Stanek Rea
*Acting Director of the United States Patent and Trademark Office*